(12) United States Patent
Hsu et al.

(10) Patent No.: US 8,816,468 B2
(45) Date of Patent: Aug. 26, 2014

(54) SCHOTTKY RECTIFIER

(75) Inventors: Chih-Wei Hsu, Taipei (TW); Florin Udrea, Cambridge (GB); Yih-Yin Lin, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 55 days.

(21) Appl. No.: 13/222,249

(22) Filed: Aug. 31, 2011

(65) Prior Publication Data

US 2012/0098082 A1    Apr. 26, 2012

Related U.S. Application Data

(60) Provisional application No. 61/405,293, filed on Oct. 21, 2010.

(51) Int. Cl.
*H01L 29/872* (2006.01)

(52) U.S. Cl.
USPC ........... 257/475; 257/115; 257/135; 257/471; 257/E29.338; 257/E21.359

(58) Field of Classification Search
USPC .................. 257/471, 115, 135, 475, E29.338, 257/E21.359
See application file for complete search history.

(56) References Cited

U.S. PATENT DOCUMENTS

| | | | |
|---|---|---|---|
| 5,101,244 A | 3/1992 | Mori et al. | |
| 6,191,447 B1 | 2/2001 | Baliga | |
| 6,252,288 B1 | 6/2001 | Chang | |
| 6,633,071 B1 | 10/2003 | Furio | |
| 6,846,729 B2 | 1/2005 | Andoh et al. | |
| 6,998,694 B2 | 2/2006 | Wu | |
| 2007/0145429 A1 | 6/2007 | Francis et al. | |
| 2009/0309181 A1* | 12/2009 | Hsieh | 257/471 |
| 2010/0314707 A1* | 12/2010 | Yedinak et al. | 257/475 |

FOREIGN PATENT DOCUMENTS

JP    05-090565 A    4/1993

* cited by examiner

*Primary Examiner* — Minchul Yang
(74) *Attorney, Agent, or Firm* — Stuart H. Mayer; Karin L. Williams; Mayer & Williams PC

(57) ABSTRACT

A semiconductor rectifier includes a semiconductor substrate having a first type of conductivity. A first layer, which is formed on the substrate, has the first type of conductivity and is more lightly doped than the substrate. A second layer having a second type of conductivity is formed on the substrate and a metal layer is disposed over the second layer. The second layer is lightly doped so that a Schottky contact is formed between the metal layer and the second layer. A first electrode is formed over the metal layer and a second electrode is formed on a backside of the substrate.

8 Claims, 6 Drawing Sheets

SCHOTTKY RECTIFIER

RELATED APPLICATIONS

This application claims priority from U.S. provisional application No. 61/405,293, filed Oct. 21, 2010, which is incorporated by reference herein in its entirety.

BACKGROUND

Conventional Schottky rectifiers are used in high speed application as alternatives to the classical PIN diodes. They have limited blocking range and their primary success is in applications that require breakdown voltages below about 200V. The main reason for their limited range of blocking voltages is due to the severe increase in the on-state forward voltage drop at high breakdowns, which in turn is caused by the decrease in the doping concentration of the drift region and concomitantly by an increase in the depth of the drift region. As a result, the specific on-state resistance of the drift region is approximately proportional to $V_{BR}^{2.5}$, where $V_{BR}$ is the breakdown voltage. This superlinear relationship between the on-state resistance and the breakdown voltage makes it difficult for Schottky rectifiers to address the market for higher blocking voltages. In addition, the high electric field present in the Schottky contact leads to a barrier lowering effect and therefore high leakage currents at high blocking voltages.

FIGS. 1 and 2 show a conventional PIN diode and a conventional Schottky rectifier, respectively. The PIN diode includes a highly doped semiconductor substrate 110 that is heavily doped with a dopant of a first conductivity type (e.g., n+ type). An epitaxial drift layer 120 is formed on the substrate 110 and is more lightly doped with a dopant of the first conductivity type (e.g., n–type). A heavily doped ohmic contact layer 130 is formed on the drift layer 120. The contact layer 130 is heavily doped with a dopant of the second conductivity type (e.g., p+ type). A cathode electrode 150 is formed on the backside of the substrate 110 and an anode metal 140 is formed over the ohmic contact layer 130.

The conventional Schottky rectifier shown in FIG. 2 includes a highly doped substrate 210 that is heavily doped with a dopant of a first conductivity type (e.g., n+ type). Similar to the PIN diode, a drift layer 220 is formed on the substrate 210 and is more lightly doped with a dopant of the first conductivity type (e.g., n– type). Then, instead of an ohmic contact layer, a metal layer 230 is formed over the drift layer 230. A Schottky contact is formed at the interface between the metal layer 230 and the drift layer 220. A cathode electrode 250 is formed on the backside of the substrate 210 and an anode metal 240 is formed over the metal layer 230.

To reduce the susceptibility of the Schottky contact to the electric field, a Trench MOS Barrier Schottky (TMBS) device has been developed. This device features multiple trench MOS cells in its active region to reduce the surface electric field and create a lateral barrier which opposes the flow of the leakage currents. As a result the off-state leakage currents are significantly reduced. Moreover, the MOS trenches also act as field plates and thus allow for a slight increase in the doping of the drift region without compromising the breakdown. However, the on-state voltage drop of the TMBS device remains an issue in high voltage applications, where the breakdown is in excess of 300V. This is because the unipolar conduction mechanism of the Schottky rectifier is not as effective as the bipolar conduction specific to PIN type diodes.

SUMMARY

In accordance with the present invention, a semiconductor rectifier is provided. The rectifier includes a semiconductor substrate having a first type of conductivity. A first layer, which is formed on the substrate, has the first type of conductivity and is more lightly doped than the substrate. A second layer having a second type of conductivity is formed on the substrate and a metal layer is disposed over the second layer. The second layer is lightly doped so that a Schottky contact is formed between the metal layer and the second layer. A first electrode is formed over the metal layer and a second electrode is formed on a backside of the substrate.

In accordance with another aspect of the invention, a method of fabricating a rectifier is provided. The method includes providing a semiconductor body of a first conductivity type and forming a first layer on the substrate. The first layer has the first type of conductivity and is more lightly doped than the substrate. A second layer is formed over the substrate. The second layer has a second type of conductivity. A metal layer is formed over the second layer. The second layer is lightly doped so that a Schottky contact is formed between the metal layer and the second layer. A first electrode is formed over the metal layer and a second electrode is formed on a backside of the substrate.

DETAILED DESCRIPTION

As detailed below, a Schottky diode or rectifier device is provided which, like conventional Schottky diodes, offers fast speed and low switching losses, but with a higher current capability and considerably lower on-state losses.

Figure 1:
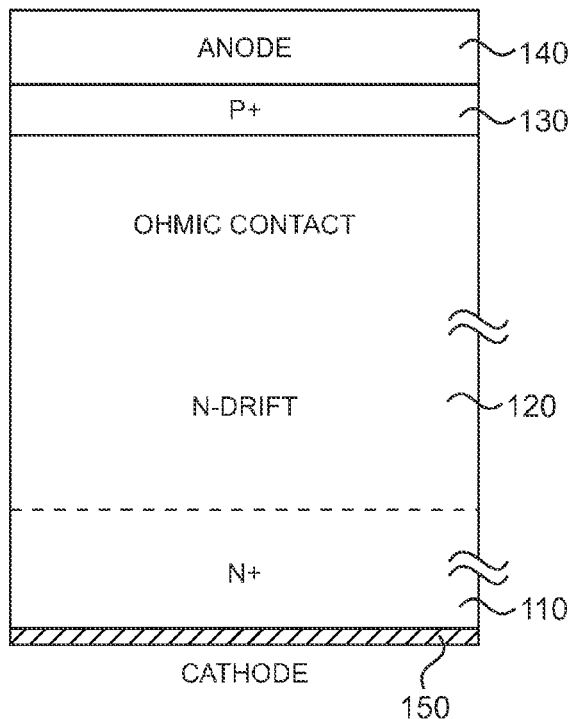
FIGS. 1 and 2 show a conventional PIN diode and a conventional Schottky rectifier, respectively.
Figure 2:
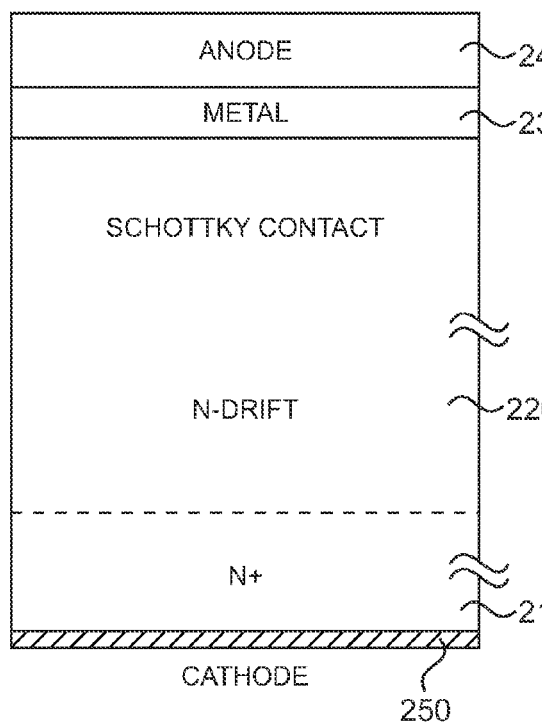
Figure 3:
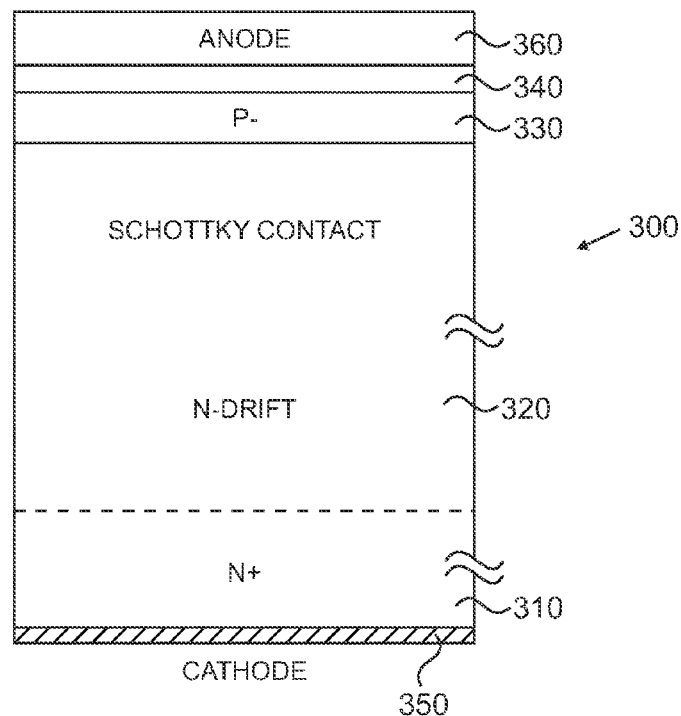
FIG. 3 shows one embodiment of a Schottky diode constructed in accordance with the principles of the present invention.

FIG. 3 shows one embodiment of a Schottky diode constructed in accordance with the principles of the present invention. As shown, the Schottky diode 300 includes a highly doped substrate 310 that is heavily doped with a dopant of a first conductivity type (e.g., n+ type). An epitaxial drift layer 320 is formed on the substrate 310 and is more lightly doped with a dopant of the first conductivity type (e.g., n– type). A lightly doped layer 330 of the second conductivity type (e.g., p– type) is formed over the drift layer 320. For reasons explained below, the lightly doped layer from time to time will be referred to as a transparent layer. After formation of the transparent layer 330, a metal layer 340, which is formed from a metal (e.g., nickel) capable of forming a silicide is deposited. Once the silicide has been formed, the metal which has not reacted with the semiconductor material is removed by a selective etch. A cathode electrode 350 is formed on the backside of the substrate 310 and an anode metal 360 is formed over the metal layer 340.

The so-called transparent layer 330 forms a Schottky contact with the metallization at its surface and a low injection efficiency junction at the interface with the n-type drift layer 320. Unlike conventional rectifying devices, this device has a mixed bipolar and unipolar conduction controlled by the p– transparent layer/n– drift layer injection and the Schottky barrier, respectively. The diode 300 has a substantially lower on-state resistance and leakage current compared to a conventional Schottky rectifier, while offering significantly faster speed and lower losses during the reverse recovery of the diode.

Figure 4:
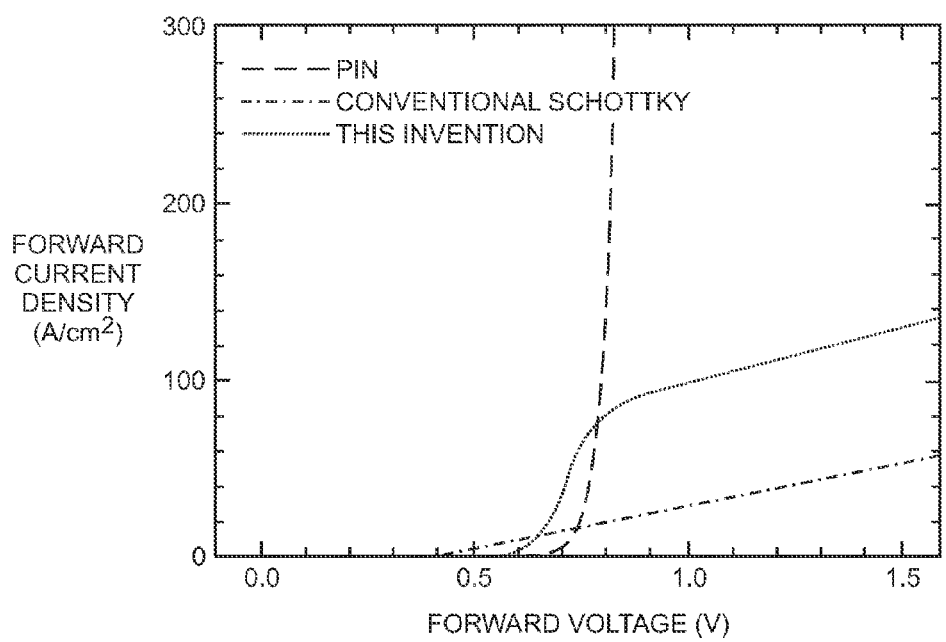
FIG. 4 shows graphs of the typical on-state characteristics of (a) conventional PIN diode, (b) a conventional Schottky rectifier and (c) the Schottky diode in accordance with the present invention.

FIG. 4 shows graphs of the typical on-state characteristics of (a) conventional PIN diode, (b) a conventional Schottky rectifier and (c) the Schottky diode 300 in accordance with the present invention. The graphs demonstrate that the diode 300 has different bends in its characteristics (due to different areas where the bipolar conduction and the Schottky limited conduction take place) and offers a significantly improved on-state capability compared to a conventional Schottky rectifier.

Figure 5:
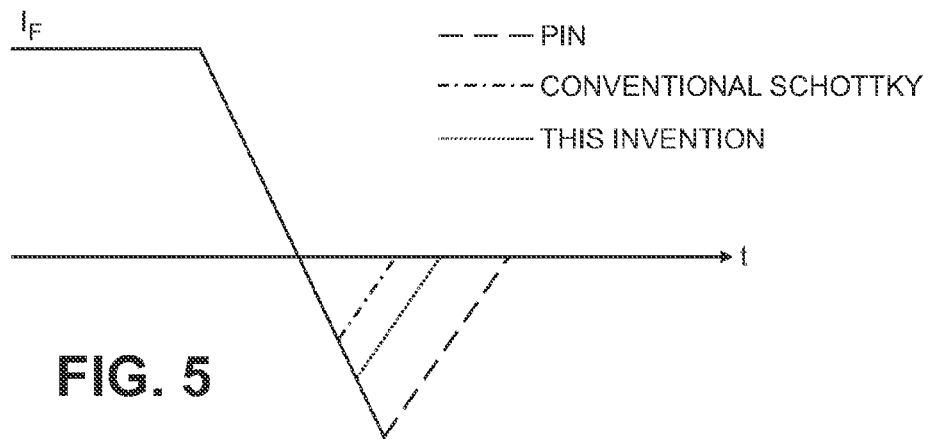
FIG. 5 shows a schematic of the typical reverse recovery characteristics of (a) a conventional PIN diode, (b) a conventional Schottky rectifier and (c) the Schottky diode in accordance with the present invention

FIG. 5 shows a schematic of the typical reverse recovery characteristics of (a) a conventional PIN diode, (b) a conventional Schottky rectifier and (c) the Schottky diode 300 in accordance with the present invention.

As FIG. 5 shows, the PIN diode, which features a p+ injection layer and an anode Ohmic contact, suffers from exceedingly high reverse leakage current, high losses and slow speeds. The Schottky diode, on the other hand, being a unipolar device, offers fast speed and low switching losses. The device 300 according to this invention is closer to the Schottky diode in terms of speed and losses but (as shown in FIG. 4) still preserves higher current capability and considerably lower on-state losses than the Schottky rectifier.

The advantageous trade-off between the on-state performance and the reverse recovery losses compared to those of both the conventional PIN diode and the Schottky rectifier is possible because of the transparent layer 330, which injects minority carriers (holes) in the drift region and allows formation of a plasma (excess of electrons and holes in quasi-neutrality equilibrium, in concentrations above the doping level). However, the injection of the plasma is limited by the Schottky contact and further controlled by the 'transparency' of the transparent layer 330. By making the transparent layer 300 more lightly doped, the transparency increases, allowing a higher fraction of electron current to penetrate through it and reach the anode contact. This results in less plasma formation in the on-state and, as a result, a faster reverse recovery response. By increasing the doping in the transparent layer, but while still preserving the Schottky contact (in other words suppressing significant tunneling specific to Ohmic contacts), the plasma level can be increased with a further increase in the on-state performance, though at the expense of increased switching losses. This trade-off will be further discussed at a later point below.

In one alternative embodiment of the invention, a Schottky rectifier is provided which is based on the previously mentioned Trench MOS Barrier Schottky (TMBS) design. This device features multiple trench MOS cells in its active region to reduce the surface electric field and create a lateral barrier which opposes the flow of the leakage currents. One example of this embodiment of the invention is shown in FIG. 6.

Figure 6:
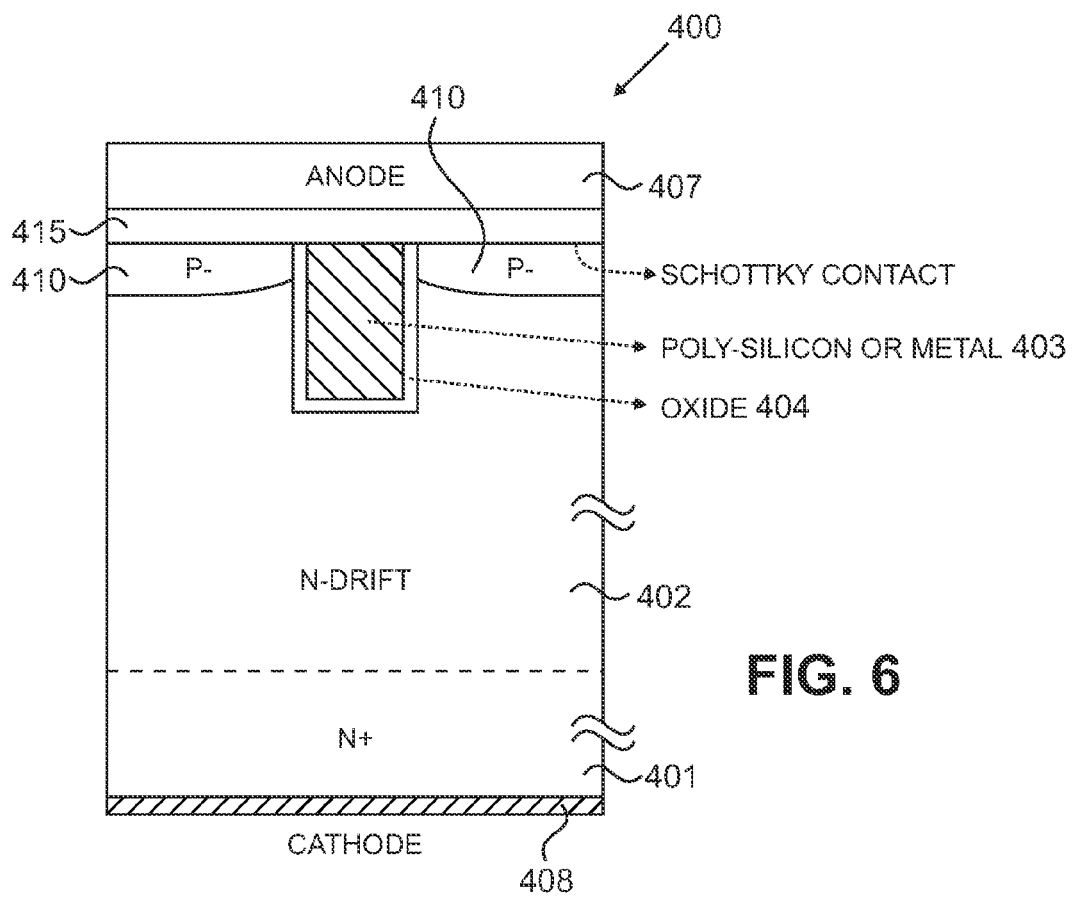
FIG. 6 shows one alternative embodiment of a Schottky rectifier which is based a Trench MOS Barrier Schottky (TMBS) design.

The TMBS diode 400 of FIG. 6 includes a heavily-doped n-type semiconductor wafer 401 on which is formed a lightly-doped n-type epitaxial layer 402. Openings are formed in this epitaxial layer, which may be, for example, trench-shaped. Conductive regions 403 are formed in the openings, which are made, for example, of doped polysilicon. An insulating layer 404 is interposed between each conductive region and the walls of the corresponding opening (e.g., trench). The insulating layer 404 may be formed, for example, by thermal oxidation and the opening may be filled with polysilicon by conformal deposition, followed by a planarization step. Transparent regions 410 (p– type in this example) can then be formed by using, for example, an implantation or diffusion technique. For instance, in one implementation the transparent regions are formed by implantation, followed by rapid annealing and possibly a light drive-in to control the dosage and junction depth of the transparent regions 410. As previously mentioned, the doping concentration (or the charge dosage) of the transparent regions 410 can be suitably adjusted to determine the appropriate trade-off between the on-state voltage and the turn-off energy losses.

After formation of the transparent regions 410, a metal, for example, nickel, capable of forming a silicide layer 415 above the epitaxial layer 402 and above the polysilicon filled areas in the trench, is deposited. Once the silicide has been formed, the metal which has not reacted with the semiconductor material is removed by selective etch. After this, an anode metal 407 is formed on the upper surface side over the metal layer 415 and a cathode metal 408 is formed on the lower surface side of the substrate 401.

Figure 7:
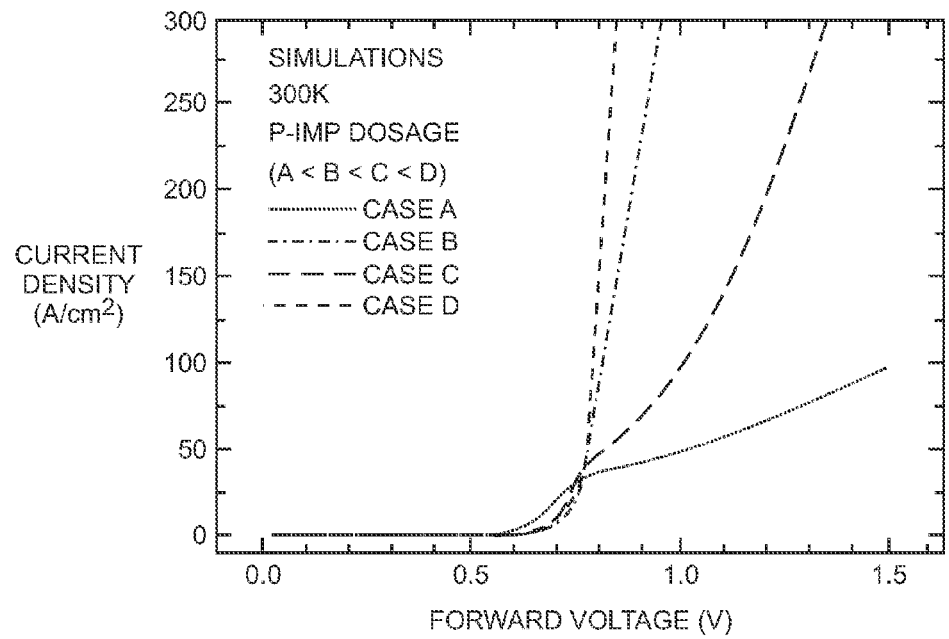
FIG. 7 shows the simulated output characteristics of the device shown in FIG. 6 for different implantation dosages in the transparent regions.

FIG. 7 shows the simulated output characteristics of the p-TMBS device for different implantation dosages in the transparent regions 410. As can be seen, the on-state voltage drop at a current density of 250 A/cm$^2$ (i.e. the operating current density) decreases with increasing implantation dosage in the transparent regions 410. The effect of increasing the doping level or the dosage in the transparent layer is that the injection efficiency of the p– transparent layer/n– drift region is increased, or the transparency is reduced. Nevertheless, at low current density, the trend is reversed because the built-in potential ($V_{bi}$) of a P/N junction is in the form of:

$$V_{bi} = KT/q \ln(N_d N_a / n_i^2) \qquad \text{Eq. (1)}$$

where K is Bolztmann constant, T is temperature on the Kelvin scale, q is electron charge, $N_d$ is electron density on the N side, and $N_a$ is the hole density on the P side. Increasing $N_a$ leads to a larger $V_{bi}$, which in turn makes it difficult for the P/N junction to conduct current until the built-in barrier is overcome.

Figure 8:
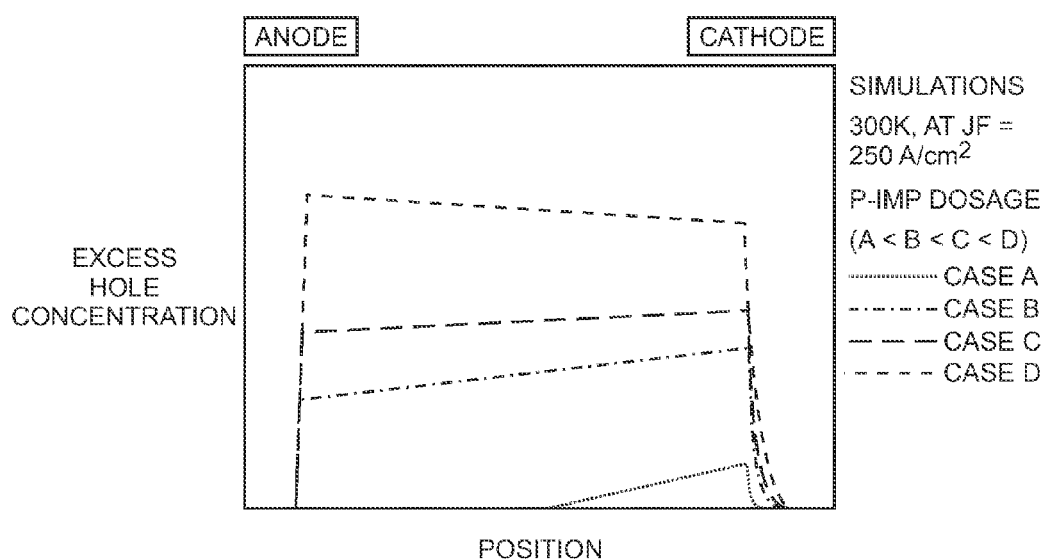
FIG. 8 shows the excess minority carrier (excess hole) distribution profiles of the device shown in FIG. 6 for different p-type implantation dosages.

The excess minority carrier (excess hole) distribution profiles of the p-TMBS device for different p-type implantation dosages are shown in FIG. 8. The excess hole concentration (equivalent to plasma) increases with the p-type implantation dosage in the transparent layer, and this is the reason why the on-state voltage varies with the dosage level. It is also noteworthy that case D, whose p-type dosage is the highest, has the largest excess hole concentration, in particular in the middle of the drift region. It has been known that the excess carriers in the middle area are the last to be removed during transient operation, and hence the fewer holes in this area, the faster the turn-off switching speed. In fact, the implantation dosage is $1\times10^{15}$ cm$^{-2}$ for case D, and this should be regarded as a p+ implant, rather than p– implant. In this case the device is virtually a PIN diode, since, due to tunneling, the contact is no longer Schottky but Ohmic.

Figure 9:
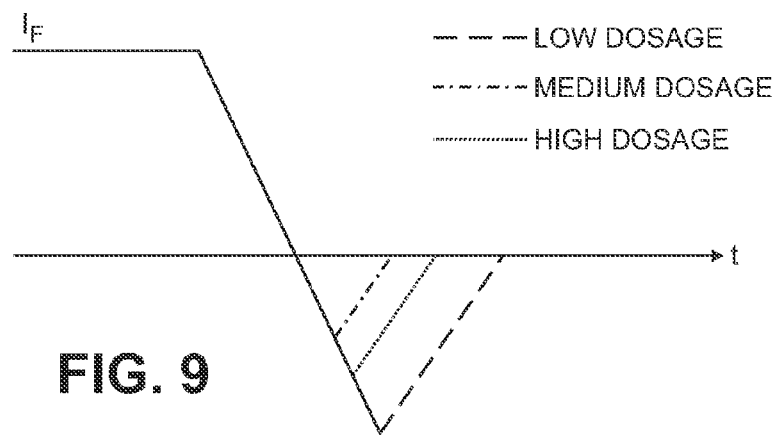
FIG. 9 is a schematic diagram of the current waveforms at turn-off transient for the device of FIG. 6.

FIG. 9 is a schematic diagram of the current waveforms at turn-off transient. It shows that the higher the implantation dosage, the longer the turn-off time. However, if the carrier concentration in the drift region is very low (as in case A, for example) then the conductivity modulation effect is trivial and the on-state voltage is found to be more than 1.5 V at a current density 250 A/cm$^2$ (see FIG. 7).

Figure 10:
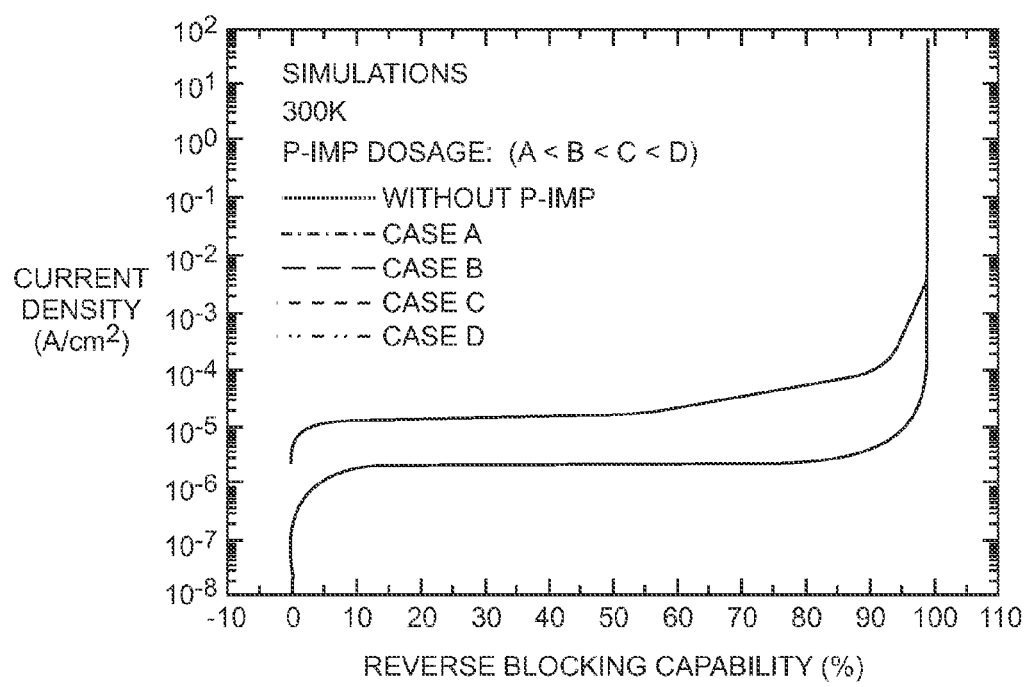
FIG. 10 illustrates the off-state blocking characteristics of the device shown in FIG. 6.

The presence of the p-transparent layer under the Schottky contact also helps to reduce the reverse leakage currents, as shown in FIG. 10, which illustrates the off-state blocking characteristics of the device. The existence of a PN junction at the anode electrode enhances the immunity of the Schottky contact against the barrier lowering effect at high electric field. Therefore, it can be seen that the device without any p-type implantation has the highest leakage current. On the other hand, the other devices, even when the p-transparent layer implantation dosage is the lowest, show the advantage of reducing reverse leakage current significantly.

In summary, a structure based on a Schottky contact and a transparent anode has been presented herein. Two embodiments have been presented by way of example: (i) a p-planar structure and (ii) p-TMBS. These structures provide several advantages over the previous solutions: (1) Due to the presence of the transparent layer, minority carriers can be injected into the drift region so that the drift region resistivity can be lowered due the presence of plasma (conductivity modulation) and the on-state voltage can be reduced; (2) The transparent layer is shallow and lightly doped and only present at limited regions, so the minority carrier injection is also limited. This gives better control of the trade-off between the on-state voltage and the switching speed; (3) Further limitation of the plasma at high current densities is due to the presence of the Schottky barrier formed between the p–transparent layer and the metallization and (4) the transparent layer can protect the Schottky contact from being affected by the electric field so that the barrier lowering effect is mitigated and the leakage current can be kept low.

Figure 11:
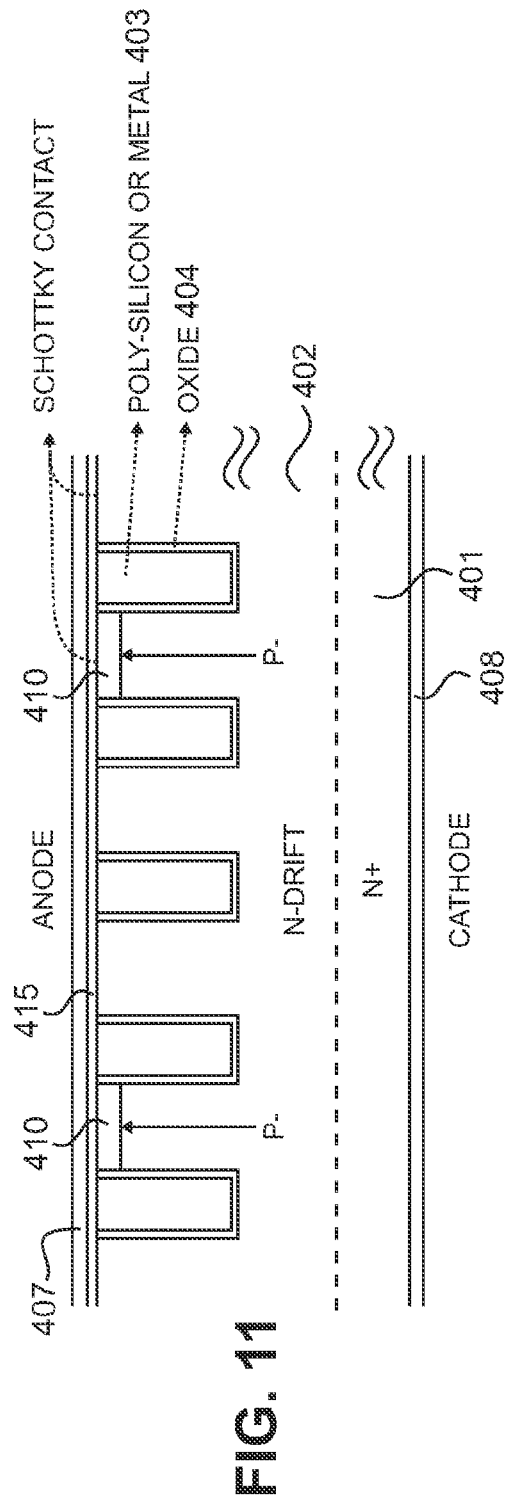
FIGS. 11 and 12 show alternative embodiments of a Schottky rectifier.
Figure 12:
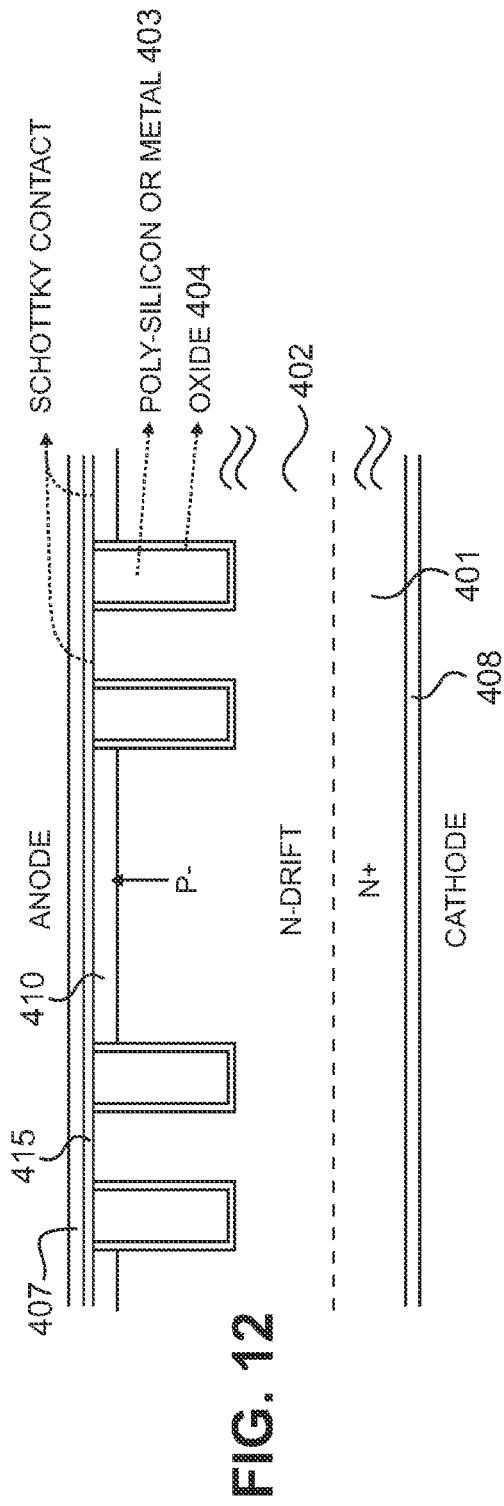

Other embodiments of the invention are shown in FIGS. 11 and 12. FIG. 11 shows that the transparent layer 410 (doped p– type in this example) is only inserted in some parts (e.g. sections/areas/cells) of the device. For instance, in this example the transparent layer 410 is only located between some pairs of adjacent MOS trenches, but not other pairs. In other parts of the device that do not include the transparent layer, a conventional TMBS is present. In this embodiment, the structure is effectively an integrated transparent Schottky diode in parallel with a conventional TMBS. FIG. 12 is a variation of FIG. 11 where the trenches are only present in the conventional TMBS cells, while the transparent layer 410 is present as a planar structure in the rest of the active area of the device.

Example

The transparent layer shown in the embodiment of FIG. 6 is arranged as regions around the trenches. The transparent layer can be formed by ion implantation and/or diffusion techniques using a suitable p-type dopant. To minimize the implantation-induced crystal damage, the implantation energy may be kept low (e.g., 25 KeV). The implantation step may be followed by an annealing step (e.g., for 60 minutes at a temperature of 950° C. so that the semiconductor surface remains sufficiently smooth to form a quality Schottky contact. Depending on the chosen design and ratings (blocking voltage capability, leakage current and turn-off speed), geometrical dimensions and conductivities of the main layers in the structure are given below:

(1) p– concentration: $1\times10^{13}$ cm$^{-3}$ to $5\times10^{18}$ cm$^{-3}$
(2) p– depth: 0.05 μm to 10 μm
(3) trench depth: 0.5 μm to 10.0 μm
(4) trench width: 0.5 μm to 5.0 μm
(5) mesa width (i.e. the spacing between the adjacent trenches): 0.3 μM to 30.0 μm
(6) N–drift region length: 5 μm to 200 μm
(7) N–drift region concentration: $5\times10^{12}$ cm$^{-3}$ to $5\times10^{17}$ cm$^{-3}$

The invention claimed is:

1. A semiconductor rectifier, comprising:
a semiconductor substrate having a first type of conductivity;
a first layer formed on the substrate having the first type of conductivity and being more lightly doped than the substrate;
a second layer formed on the substrate having a second type of conductivity, said second type of conductivity being opposite to said first type of conductivity;
a metal layer disposed directly over the second layer, wherein the second layer is lightly doped so that a Schottky contact is formed between the metal layer and the second layer;
a first electrode formed over the metal layer and a second electrode formed on a backside of the substrate;
at least one trench formed in the first layer;
a dielectric layer lining a bottom and sidewalls of the at least one trench; and
a conducting material filling the at least one trench,
wherein the at least one trench comprises a plurality of trenches formed in the first layer and the second layer is formed in the first layer between only select pairs of trenches, not all pairs of trenchs.

2. The semiconductor rectifier of claim 1 wherein the second layer has a doping concentration less than that needed to form an Ohmic contact between the metal layer and the second layer.

3. The semiconductor rectifier of claim 1 wherein the second layer is formed in the first layer and is adjacent to at least one side of the trench.

4. The semiconductor rectifier of claim 3 wherein the second layer is adjacent to both sides of the trench.

5. The semiconductor rectifier of claim 1 wherein a silicide layer is formed at an interface between the metal layer and second layer.

6. The semiconductor rectifier of claim 1, wherein the second layer is formed between only some pairs of adjacent MOS trenches.

7. The semiconductor rectifier of claim 6 wherein a TMBS is present in parts of the device that do not include the second layer.

8. The semiconductor rectifier of claim 1 wherein the plurality of trenches are present only in parts of the rectifier having conventional TMBS cells, and wherein the second layer is present as a planar structure in a remaining active area of the device.

* * * * *